(12) United States Patent
Rosenblatt et al.

(10) Patent No.: US 10,644,217 B2
(45) Date of Patent: *May 5, 2020

(54) FLIP CHIP INTEGRATION ON QUBIT CHIPS

(71) Applicant: International Business Machines Corporation, Armonk, NY (US)

(72) Inventors: Sami Rosenblatt, White Plains, NY (US); Jason S. Orcutt, Katonah, NY (US); Martin O. Sandberg, Ossining, NY (US); Markus Brink, White Plains, NY (US); Vivekananda P. Adiga, Ossining, NY (US); Nicholas T. Bronn, Long Island City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/251,569

(22) Filed: Jan. 18, 2019

(65) Prior Publication Data

US 2019/0165241 A1 May 30, 2019

Related U.S. Application Data

(63) Continuation of application No. 15/823,675, filed on Nov. 28, 2017, now Pat. No. 10,355,193.

(51) Int. Cl.
*H01L 39/22* (2006.01)
*H01L 39/04* (2006.01)
(Continued)

(52) U.S. Cl.
CPC .......... *H01L 39/025* (2013.01); *G06N 10/00* (2019.01); *H01L 25/0657* (2013.01);
(Continued)

(58) Field of Classification Search
CPC .... G06N 99/002; G06N 10/00; H01L 39/025; H01L 39/045; H01L 39/2439;
(Continued)

(56) References Cited

U.S. PATENT DOCUMENTS 4,163,156 A 7/1979 Daetwyler
4,220,959 A 9/1980 Kroger
(Continued)

FOREIGN PATENT DOCUMENTS

DE 102009033566 A1 1/2011
EP 2202545 A1 6/2010
(Continued)

OTHER PUBLICATIONS

Notification of Transmittal of The International Search Report and The Written Opinion of The International Searching Authority, or The Declaration, dated Jan. 30, 2019, International application No. PCT/EP2018/080735, 16 pages.
(Continued)

*Primary Examiner* — Minh Loan Tran
(74) *Attorney, Agent, or Firm* — Jared L. Montanaro

(57) ABSTRACT

A quantum bit (qubit) flip chip assembly may be formed when a qubit it formed on a first chip and an optically transmissive path is formed on a second chip. The two chips may be bonded. The optically transmissive path may provide optical access to the qubit on the first chip.

20 Claims, 10 Drawing Sheets

(51) Int. Cl.

| | | |
|---|---|---|
| *H01L 39/02* | (2006.01) | |
| *H01L 39/24* | (2006.01) | |
| *H01L 25/00* | (2006.01) | |
| *H01L 25/065* | (2006.01) | |
| *H01L 27/18* | (2006.01) | |
| *G06N 10/00* | (2019.01) | |
| *H01L 23/544* | (2006.01) | |

(52) U.S. Cl.
CPC .............. *H01L 25/50* (2013.01); *H01L 27/18* (2013.01); *H01L 39/045* (2013.01); *H01L 39/223* (2013.01); *H01L 39/2493* (2013.01); *H01L 23/544* (2013.01); *H01L 2223/54426* (2013.01); *H01L 2224/131* (2013.01); *H01L 2224/16145* (2013.01); *H01L 2224/81203* (2013.01); *H01L 2224/81815* (2013.01); *H01L 2225/06513* (2013.01); *H01L 2225/06534* (2013.01); *H01L 2225/06541* (2013.01); *H01L 2225/06593* (2013.01)

(58) Field of Classification Search
CPC ... H01L 39/223; H01L 25/0657; H01L 25/50; H01L 39/2493
See application file for complete search history.

(56) References Cited

U.S. PATENT DOCUMENTS

| | | | |
|---|---|---|---|
| 4,490,901 | A | 1/1985 | Clark et al. |
| 4,535,219 | A | 8/1985 | Sliwa, Jr. |
| 6,218,214 | B1 | 4/2001 | Panchou et al. |
| 6,232,212 | B1 | 5/2001 | Degani et al. |
| 6,495,915 | B1 | 12/2002 | Hsieh et al. |
| 6,630,723 | B2 | 10/2003 | Hedler et al. |
| 7,002,166 | B2 | 2/2006 | Jamieson et al. |
| 7,122,837 | B2 | 10/2006 | Linares et al. |
| 7,176,066 | B2 | 2/2007 | Brenner et al. |
| 7,343,059 | B2 | 3/2008 | Beausoleil et al. |
| 7,394,268 | B2 | 7/2008 | Bertin et al. |
| 7,411,187 | B2 | 8/2008 | Monroe et al. |
| 7,466,725 | B2 | 12/2008 | Ichimura et al. |
| 7,679,166 | B2 | 3/2010 | Anderson et al. |
| 7,899,092 | B2 | 3/2011 | Malinovsky |
| 7,977,668 | B2 | 7/2011 | Nevirkovets et al. |
| 8,054,072 | B2 | 11/2011 | Ichimura et al. |
| 8,111,083 | B1 | 2/2012 | Pesetski et al. |
| 8,148,715 | B2 | 4/2012 | Hollenberg et al. |
| 8,329,556 | B2 | 12/2012 | Yuan et al. |
| 8,440,471 | B2 | 5/2013 | Ranjan et al. |
| 8,816,325 | B2 | 8/2014 | Schenkel et al. |
| 9,054,298 | B2 | 6/2015 | Zhou et al. |
| 9,082,637 | B2 | 7/2015 | Taylor |
| 9,208,280 | B2 | 12/2015 | Bocharov et al. |
| 9,219,298 | B2 * | 12/2015 | Abraham et al. |
| 9,350,460 | B2 | 5/2016 | Paik |
| 9,355,362 | B2 | 5/2016 | Shea |
| 9,443,200 | B2 | 9/2016 | Schroff |
| 9,524,470 | B1 | 12/2016 | Chow et al. |
| 9,599,904 | B2 | 3/2017 | Schubert et al. |
| 9,607,271 | B2 | 3/2017 | Papile |
| 9,647,662 | B1 | 5/2017 | Abutaleb et al. |
| 9,858,531 | B1 | 1/2018 | Monroe |
| 10,134,972 | B2 | 11/2018 | Oliver |
| 10,170,681 | B1 | 1/2019 | Rosenblatt |
| 10,355,193 | B2 * | 7/2019 | Rosenblatt |
| 10,423,888 | B1 | 9/2019 | Hertzberg et al. |
| 2002/0074544 | A1 | 6/2002 | Sung et al. |
| 2003/0193097 | A1 | 10/2003 | Il'ichev et al. |
| 2005/0074220 | A1 | 4/2005 | Rey |
| 2005/0170572 | A1 | 8/2005 | Hongo et al. |
| 2007/0272669 | A1 | 11/2007 | Comley et al. |
| 2008/0258049 | A1 | 10/2008 | Kuzmich et al. |
| 2009/0057652 | A1 | 3/2009 | Nevirkovets et al. |
| 2013/0003188 | A1 | 1/2013 | Andreasch et al. |
| 2013/0029848 | A1 | 1/2013 | Gonzalez et al. |
| 2013/0119351 | A1 | 5/2013 | Shea et al. |
| 2013/0258595 | A1 * | 10/2013 | Tuckerman |
| 2014/0328116 | A1 | 11/2014 | Guo |
| 2015/0021726 | A1 | 1/2015 | Min et al. |
| 2015/0310350 | A1 | 10/2015 | Niskanen et al. |
| 2015/0316598 | A1 | 11/2015 | Rogge et al. |
| 2016/0292586 | A1 | 10/2016 | Rigetti et al. |
| 2016/0321558 | A1 | 11/2016 | Nakamura et al. |
| 2016/0343934 | A1 | 11/2016 | Chang et al. |
| 2016/0344414 | A1 | 11/2016 | Naaman et al. |
| 2017/0001900 | A1 | 1/2017 | Marjanovic et al. |
| 2017/0059964 | A1 | 3/2017 | Nakamura et al. |
| 2017/0072504 | A1 | 3/2017 | Abraham et al. |
| 2017/0076787 | A1 | 3/2017 | Frank |
| 2017/0077382 | A1 | 3/2017 | Abraham et al. |
| 2017/0177534 | A1 | 6/2017 | Mohseni |
| 2018/0012932 | A1 | 1/2018 | Oliver |
| 2018/0013052 | A1 * | 1/2018 | Oliver et al. |
| 2018/0102469 | A1 | 4/2018 | Das |
| 2018/0102470 | A1 | 4/2018 | Das |
| 2018/0337790 | A1 | 11/2018 | Brink et al. |
| 2019/0051810 | A1 | 2/2019 | Brink et al. |

FOREIGN PATENT DOCUMENTS

| | | |
|---|---|---|
| JP | 3198655 B2 | 8/2001 |
| JP | 2007193778 A | 8/2007 |
| WO | 9822985 A2 | 5/1998 |
| WO | 2017075246 A1 | 5/2017 |
| WO | 2017105524 A1 | 6/2017 |
| WO | 2017131831 A2 | 8/2017 |

OTHER PUBLICATIONS

Braslau et al, "Fabrication of Planar Josephson Junctions by Laser Irradiation", An IP.com Prior Art Database Technical Disclosure, Original Publication Date: Apr. 1, 1976, IP.com No. IPCOM000085574D, IP.com Electronic Publication Date: Mar. 2, 2005, 2 pages.

Baek et al. "Thermal stability of Nb/a-NbxSi 1-x/NB Josephson junctions", Physical Review B 75, 054514 pp. 1-6 (2007) (Year: 2007).

Chen et al. "Qubit architecture with high coherence and fast tunable coupling." Physical review letters 113.22 (2014): 220502, abstract, 5 pgs.

Duocastella et al., "Bessel and annual beams for materials processing," Laser Photonics Rev. 6, No. 5, 607-621 (2012), DOI 10.1002/lpor.201100031.

Gilabert et al., "Photoinduced enhancement of the Josephson effect in YBaCuO grain boundary junctions," Journal of Low Temperature Physics, Feb. 1997, vol. 106, Issue 3, pp. 255-264.

Granata et al., "Induced change of critical current density profile in Nb/Al—AlOx/Nb Josephson junctions," Journal of Physics: Conference Series 507 (2014) 042046, 5 pgs.

Granata et al., "Localized laser trimming of critical current in niobium based Josephson devices," App. Phys. Lett. 90, 232503 (2007), doi: 10.1063/1.2746060, 4 pgs.

Granata et al., "Spatial modulation of critical current density in niobium based Josephson junctions induced by selective heating," Appl. Phys. Lett. 102, 222603 (2013); doi: 10.1063/1.4809737, 5 pgs.

Granata et al., "Trimming of Critical Current in Niobium Josephson Devices by Laser Annealing", 8th European Conference on Applied Superconductivity (EUCAS 2007), Journal of Physics: Conferences Series 97 (2008), Copyright 2008, 6 Pages, IOP Publishing.

Hadden et al., "Waveguide-coupled single NV in diamond enabled by femtosecond laser writing", Apr. 7, 2010, 5 Pages, Institute for Quantum Science and Technology, University of Calgary, Calgary, Canada.

Hertzberg et al., "Frequency Tuning of Multi-Qubit Systems", U.S. Appl. No. 15/824,492, filed Nov. 28, 2017.

Hutchings et al. "Tunable Superconducting Qubits with Flux-Independent Coherence." arXiv preprint arXiv:1702.02253 (2017), pp. 1-17.

(56) References Cited

OTHER PUBLICATIONS

Knoernschild et al., "Independent individual addressing of multiple neutral atom qubits with a micromirror-based beam steering system", Applied Physics Letters 97, Sep. 2010, 3 Pages, Copyright 2010 American Institute of Physics.

Lagoudakis et al., "Initialization of a spin qubit in a site-controlled nanowire quantum dot", New Journal of Physics, 2016, 8 Pages, Published in a partnership with Deutsche Physlakalsche Gesellschaft and the Institute of Physics, IOP Science, Canada.

Lee et al., "3D Stacked Flip Chip Packaging with Through Silicon Vias and Copper Plating or Conductive Adhesive Filling", 2005 Electronic Components and Technology Conference, Copyright 2005 IEEE, 7 pages.

List of IBM Patents or Patent Applications Treated as Related, Jan. 17, 2019, 2 pages.

Mehta et al., "Integrated Optical Adressing of an ion quibit", Nature Nanotechnology, Dec. 2016, pp. 1066-1070, Copyright 2016 Macmillan Publishers Limited, Department of Electrical Engineering & Computer Science and Research Laboratory of Electronics, Massachusetts Institute of Technology, Cambridge, MA.

Mount et al., "Single qubit manipulation in a microfabricated surface electrode ion trap," New Journal of Physics, vol. 15, Sep. 2013, 17 pgs.

Orcutt et al., "Adjustment of Qubit Frequency Through Annealing", U.S. Appl. No. 15/824,438, filed Nov. 28, 2017.

Pavolotsky et al., "Aging- and annealing-induced variations in Nb/Al—AlOx/Nb tunnel junction properties", Journal of Applied Physics 109, 024502 ( 2011) pp. 1-5 (Year: 2011).

Pop et al., "Fabrication of stable and reproducible sub-micron tunnel junctions", arXiv:1105.6204v1 [cond-mat.mes-hall], May 31, 2011 (Year: 2011).

Rioux et al., "Linear, annular, and radial focusing with axicons and applications to laser machining", Applied Optics, vol. 17, Issue 10, pp. 1532-1536 (1978), https://doi.org/10.1364/AO.17.001532, Abstract Only.

Rodin et al., "High Throughput Low CoO Industrial Laser Drilling Tool", Research Gate, Center for Physical Sciences and Technology, Jul. 2008, 7 pages.

Rosenblatt et al., "Laser Annealing of Qubits With Structured Illumination", U.S. Appl. No. 15/823,713, filed Nov. 28, 2017.

Rosenblatt et al., "Laser Annealing of Qubits With Structured Illumination", U.S. Appl. No. 16/183,376, filed Nov. 7, 2018.

Rosenblatt et al., "Laser Annealing Qubits for Optimized Frequency Allocation", U.S. Appl No. 15/823,728, filed Nov. 28, 2017.

Rosenblatt et al., "Flip Chip Integration on Qubit Chips," U.S. Appl. No. 15/823,675, filed Nov. 28, 2017.

Saffman, "Quantum Computing with Atomic Qubits and Rydberg Interactions: Progress and Challenges", Journal of Physics B: Atomic, Molecular and Optical Physics, May 17, 2016, 25 Pages, OP Publishing Ltd., Copyright 2016, UK.

Shim et al., "Bottom-up superconducting and Josephson junction devices inside a Group-IV semiconductor," Nature Communications, 5, 4225 (2014), arXiv:1309.0015v3, 9 pgs.

Wale, "Self Aligned, Flip Chip Assembly of Photonic Devices with Electrical and Optical Connections", Electronic Components and Technology Conference, 1990, IEEE, 8 pages.

International Search Report and Written Opinion, International Application No. PCT/EP2018/080736, 10 pgs., dated Mar. 6, 2019.

Kamal et al., "Improved superconducting qubit coherence with high-temperature substrate annealing", arXiv:1606.09262v1 [cond-mat.mes-hall] Jun. 29, 2016, pp. 1-10.

List of IBM Patents or Patent Applications Treated as Related, Jul. 30, 2019, 2 pgs.

Orcutt et al., "Adjustment of Qubit Frequency Through Annealing," U.S. Appl. No. 16/520,490, filed Jul. 24, 2019.

Brink et al., "Device challenges for near term superconducting quantum processors: frequency collisions," IEDM18-126, pp. 6.1.1-6.1.3., © 2018 IEEE.

Chamberland et al., "Topological and subsystem codes on low-degree graphs with flag qubits", arXiv:1907.09528v1 [quant-ph] Jul. 22, 2019, pp. 1-20.

Hutchings et al., "Tunable Superconducting Qubits with Flux-Independent Coherence", arXiv:1702.02253v2 [cond-mat.supr-con] Feb. 21, 2017, pp. 1-17.

Magesan et al., "Effective Hamiltonian models of the cross-resonance gate", arXiv:1804.04073v2 [quant-ph] Feb. 25, 2019, pp. 1-16.

Wu Yu-Lin et al., "Fabrication of Al/Alox/Ai Josephson junctions and superconducting quantum circuits by shawdow evaporation and a dynamic oxidation process", 2013 Chines Phys. B vol. 22, No. 6 (2014), pp. 060309-1-060309-5.

Pavlovic, D., "Relating toy models of quantum computation: comprehension, complementarity and dagger mix autonomous categories," arXiv:1006.1011v1, Jun. 5, 2010, 21 pgs.

* cited by examiner

FLIP CHIP INTEGRATION ON QUBIT CHIPS

BACKGROUND

The present disclosure relates to chip fabrication, and more specifically, to chip fabrications for use in quantum computing.

Integrated circuit technologies include three-dimensional integrated circuits. One type of 3D integrated circuit may include two or more layers of active electronic components stacked vertically and electrically joined with through-substrate vias and solder bumps. The 3D integrated circuit may provide numerous benefits such as increased package density, yielding a smaller footprint, and improved bandwidth due to the short connection lengths made possible by the use of through-silicon-vias. The 3D integrated circuit described above may be fabricated in any number of known methods. Some 3D integrated circuits may include a silicon interposer, which may be used to re-direct circuitry between a carrier and one or more top chips.

Quantum computing uses computation systems to manipulate quantum-mechanical phenomena, such as superposition and entanglement, to effect information processing. A classical computer utilizing Von Neumann architecture processes binary data represented as 1 or 0. In quantum computing, a quantum bit (or "qubit") can hold a state of 0, 1, or a superposition of states.

SUMMARY

Embodiments of the present disclosure may be directed to a method for forming a quantum bit (qubit) flip-chip assembly. A qubit may be formed on a first chip, and an optically transmissive path may be formed on a second chip. The first chip and the second chip may be bonded. The optically transmissive path may be located above the qubit.

Embodiments of the present disclosure may be directed toward a flip chip apparatus with a first and second chip. The first chip may contain a qubit and the second chip may be bonded to the first chip with solder bumps. The second chip may have an optically transmissive path to allow for optical access to the qubit on the first chip.

The above summary is not intended to describe each illustrated embodiment or every implementation of the present disclosure.

Embodiments of the present disclosure may be directed toward a method for forming a quantum bit (qubit) flip chip assembly. The method may include forming a qubit on a first chip. An optically transmissive path may then be formed on the second chip. The first and the second chip may be bound, to locate the optically transmissive path adjacent (e.g., above, below, etc.) the qubit.

Embodiments of the present disclosure may be directed toward a flip chip apparatus that comprises a first chip with quantum bits (qubits) and a second chip. The second chip may be bonded to the first chip with solder bumps. An optically transmissive path in the second chip may provide optical access to the qubit on the first chip.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
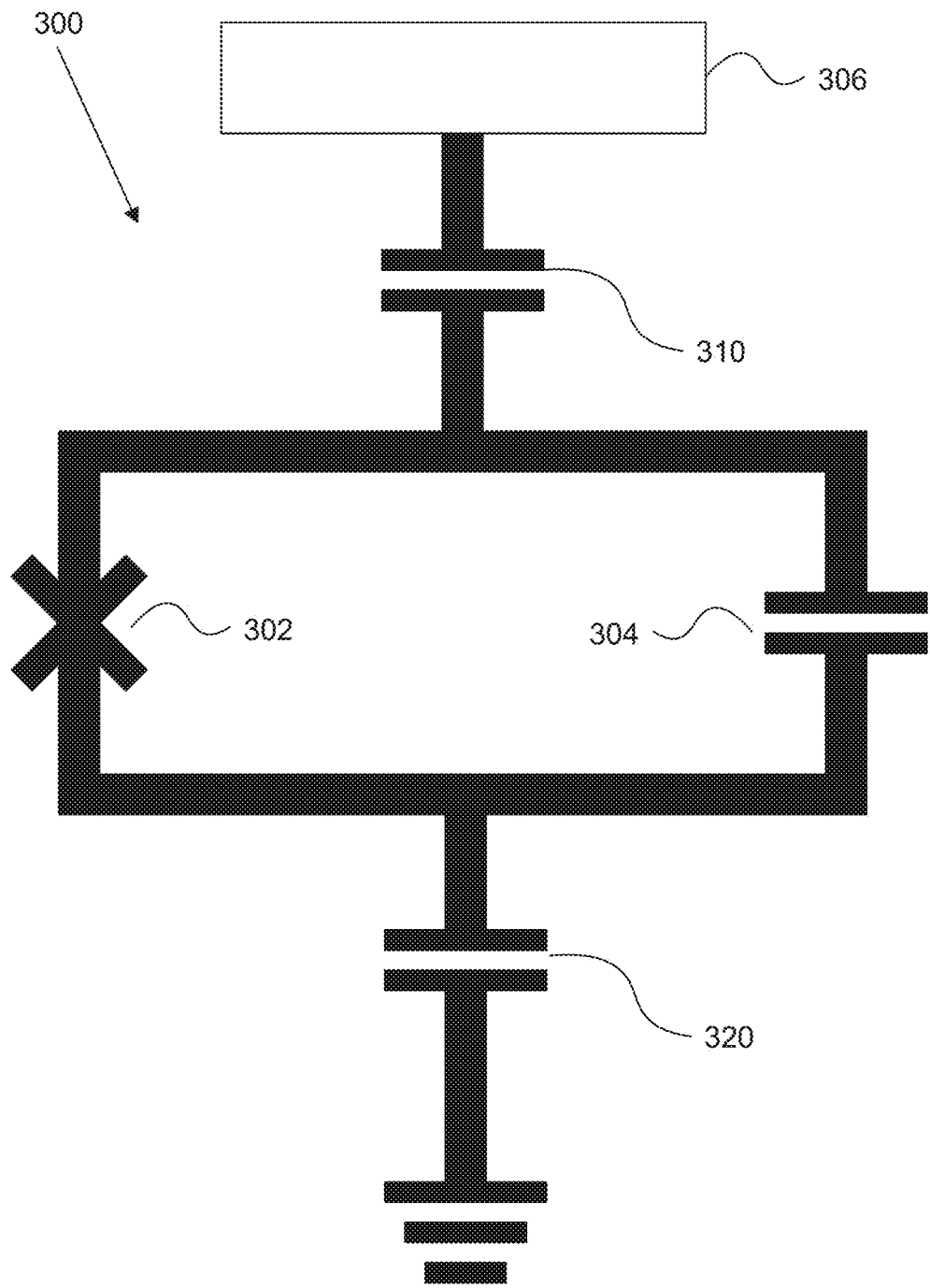
FIG. 1 depicts a qubit containing a Josephson junction and a capacitor connected in parallel, in accordance with embodiments of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Example embodiments will now be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

According to embodiments, in quantum computing, a qubit circuit may be used, rather than a traditional integrated circuit. In qubit circuits, it may be useful to change the frequency of a particular qubit following fabrication or operation. In embodiments, as described herein, frequency tuning may be accomplished using focused annealing, for example, by using a laser beam or a focused ion beam. For various reasons, the focused annealing (i.e., tuning of the frequency of the qubit) may be performed after a chip containing the qubit is fabricated. The fabricated structure may be a flip chip, which may comprise two or more chips stacked on top of each other, and may be electrically connected, for example, by solder bumps. The flip chip may contain a top chip and a bottom chip. The bottom chip may contain one or more qubits and be referred to as a qubit chip, and the top chip may contain the input/output circuitry and be referred to as an I/O chip.

A flip chip constructed with the I/O chip on top and the qubit chip on the bottom may leave the qubit inaccessible for focused laser annealing. Thus, a window or other optically transmissive path or paths in the top chip may facilitate accessing the qubit for frequency tuning using focused annealing. The optically transmissive path is an aperture or pathway through which light of any spectrum (e.g., infrared, visual, ultraviolet) can be transmitted. According to embodiments of the present invention, the top chip may be designed in several ways described herein to provide optical access to a qubit in the bottom chip.

The qubit flip-chip assembly may be fabricated by attaching a chip that includes a I/O chip to a qubit chip that contains one or more qubits. The I/O chip and the qubit chip may be attached to one another using a plurality of solder bumps. An optically transmissive path, as discussed herein, may be created in the I/O chip. This path may be created using a variety of techniques described herein. The path may be created such that it aligns with a corresponding qubit, thereby providing optical access to the corresponding qubit. The path may have an aperture with a diameter that is large enough to allow for sufficient access to the qubit for treatment of the qubit (e.g., laser annealing for frequency tuning, sputtering, ion etching, or other treatment). In embodiments, an optically transparent substrate in the qubit chip may allow for treatment of the qubit from the backside of the chip assembly. In embodiments, the transparent substrate is Magnesiumoxide (MgO).

Multi-qubit chips are employed in creating quantum computing systems. However, each additional qubit added to a chip adds to the design complexity of the chip, as a qubit may have quantum interactions with other proximate qubits, based on their resonance frequency. Such behavior constitutes a failure mode known as a "frequency collision." Frequency collisions can be predicted by modeling of the quantum-mechanical system. A non-limiting example of frequency collision happens when the resonance frequency of two proximate qubits are similar (e.g., when the frequency of one qubit equals the frequency of another qubit). In order to achieve high performance it is desirable to be able to set the frequency of each qubit very precisely. Traditionally, adjustable magnetic fields have been used to shift the frequency of qubits, but the necessary tuning circuits tend to introduce noise and add extra complexity within a multi-qubit system.

In example embodiments of the present invention, the qubit includes the following properties: during measurement, the qubit is projected into one of two different states ($|A>$ or $|B>$). Read-out occurs while the two states $|A>$ and $|B>$ are stable, after which the qubit decoheres. The readout resonator attains a resonance frequency based upon the state of the projected qubit.

The projected state of the qubit can be inferred based on the readout resonator frequency, which can be determined based on the reflection or transmission coefficient of the readout resonator. This can be accomplished through various techniques. In an example technique, a microwave signal is applied to the input of the circuit and is tuned to a frequency approximately equal to the resonance frequency of one of the post measurement quasi-stable states in accordance with one example embodiment. When the qubit is projected into the measured state, the applied microwave signal either transmits to the output or is reflected by the readout resonator, depending on the coupling of the qubit to the transmission lines. Therefore, depending on the qubit state, the microwave signal will acquire a specific magnitude and phase. The determination of the qubit state from this signal can be done in a variety of ways, for example, using IQ mixers, threshold detectors and so forth. Other various methods for measuring frequency or state may be used as well.

In some cases, additional amplifiers such as SQUID amplifiers or HEMT amplifiers may be required as well as room temperature microwave electronics such as IQ mixers, and so forth.

Referring now to FIG. 1, illustrated is a qubit 300, in accordance with embodiments of the present invention. In some embodiments, the qubit 300 contains a Josephson junction 302 and a capacitor 304 connected in parallel with one another, as shown in FIG. 1. The parallel Josephson junction 302 and capacitor 304 arrangement is capacitively coupled by a coupling capacitor 310 to structure 306, as well as capacitively coupled by a coupling capacitor 320 to ground. While only a single structure is shown capacitively coupled to the Josephson junction 302 and capacitor 304, multiple structures may be attached to the parallel Josephson junction 302 and capacitor 304 arrangement depicted. For example, a readout structure and interconnects to other qubit structures may each be capacitively connected to the parallel Josephson junction 302 and capacitor 304 arrangement. Additionally, while qubit 300 is depicted as using coupling capacitor 310 and coupling capacitor 320, other methods of electrically connecting the qubit may be used. In accordance with one example embodiment, the capacitor 304 is in the range of 0.1 femtofarads (fF) to 200 femtofarads (fF). In accordance with one example embodiment, the Josephson junction 302 has an effective critical current ranging approximately from 10 to 100 nanoamperes. The critical current is related to the overall resistance of the Josephson junction, prior to achieving a superconducting state as predicted by the Ambegaokar-Baratoff relation. More specifically, the relation predicts that the resistance of the Josephson junction prior to achieving the superconducting state is inversely proportional to the critical current after turning superconducting. Furthermore, this critical current is also inversely proportional to the inductance of the Josephson junction.

As a result, the resonance frequencies of the qubit range approximately between a few hundred MHz up to about 20 GHz. The coupling capacitor 310 of the qubit can be engineered for high fidelity readout. The qubit described in this example embodiment is also known as a single-junction transmon qubit. Such a qubit is not susceptible to tuning using a magnetic field and its resonance frequency is therefore fixed by the parameters of the capacitor and junction formed at the time of fabrication. Other embodiments may utilize a qubit of another type (e.g., a phase qubit, a charge qubit). In other embodiments, two or more Josephson junctions arranged as series or parallel circuit elements may substitute for the single Josephson junction 302 depicted in FIG. 1.

Figure 2:
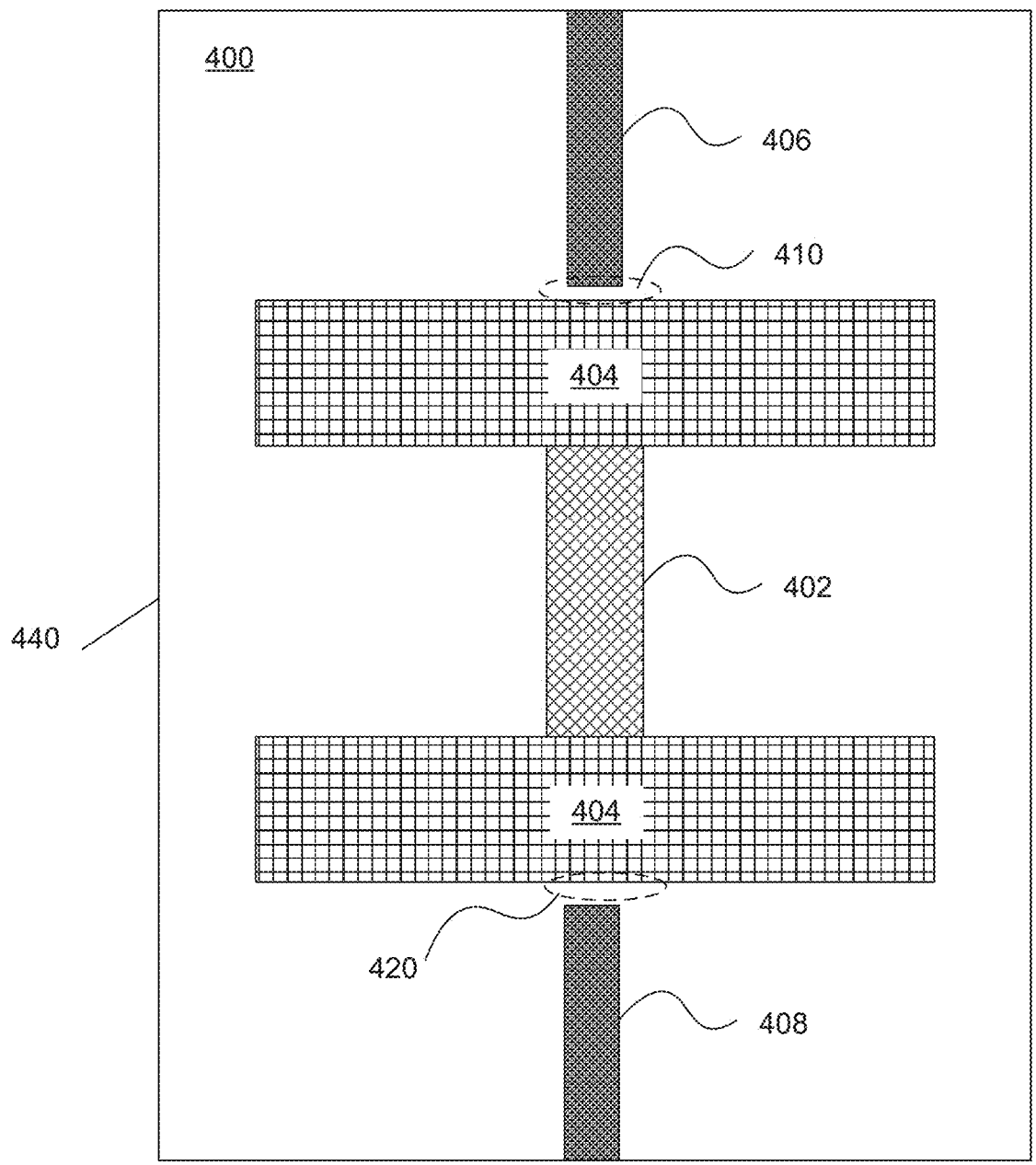
FIG. 2 depicts a top view of a substrate for fabrication of a Josephson junction, in accordance with embodiments of the present invention.

Referring now to FIG. 2, illustrated is an example layout of an embodiment of the capacitively coupled qubit depicted in FIG. 1 following fabrication on substrate 400, in accordance with embodiments of the present invention. Fabrication of Josephson junction 402 may proceed by, for example, (1) subtractive patterning of a trilayer (superconductor(s)-insulator-superconductor(s)) material stack or (2) the Dolan bridge technique. The Dolan Bridge technique is described herein as an illustrative example. In such technique, the Josephson junction 402 is patterned between capacitive plates 404, which may be capacitively coupled, via capacitor 410, to line 406, and capacitively coupled to ground line 408, via capacitor 420, all located on substrate 400. While only a single line 406 is depicted, multiple lines may be communicatively coupled to capacitive plates 404, thus capacitively connecting qubit 400 to a plurality of structures.

In the example embodiment depicted in FIG. 2, the substrate 400 on which the qubit circuit is formed can be high resistivity (intrinsic) eight-inch silicon wafers. A bilayer of resist is spun on the wafers, such as a copolymer methyl methacrylate (MMA) layer and a subsequent thinner layer of polymethyl methacrylate (PMMA). Using electron-beam lithography, a pattern for the Josephson junction 402 is written into the resist. This step is followed by development in an MIBK:IPA (Methyl Isobutyl Ketone (MIBK) Isopropyl alcohol (IPA)) (1:3) solution for about one minute, which removes areas of the resist exposed to the electron beam. The MMA layer is more sensitive to the electron beam, which creates areas of undercut PMMA. As such, a suspended bridge out of the PMMA, also called a Dolan bridge, can be made with no MMA beneath. The sample is placed in an e-beam evaporator where Al is evaporated at two angles with oxidation (in an $Ar/O_2$ atmosphere) between Al evaporations. The junction is formed in the overlap area. The remaining resist and unwanted metal is removed by placing the sample in acetone. Using this lift-off technique, junction areas can be made ranging from 0.01 $\mu m^2$ to 1 $\mu m^2$. This basic fabrication process can be used with other extra fabrication steps such as PECVD, optical lithography, and ME to make other devices. In example embodiments, the Josephson junction 402 is fabricated on a silicon (Si) substrate using aluminum as a starting compound to form an Al/AlOx/Al structure. In an example embodiment, the substrate 400 is selected to reduce dielectric loss tangent at low temperatures. The substrate 400 may also be selected to be a material which can be etched selectively to the superconducting and dielectric material to be used for the Josephson junction 402. For example, high resistivity Si wafers may be implemented.

In the example embodiment depicted in FIG. 2, capacitive plates 404 may comprise superconducting materials such as, for example, Nb, NbN, NbCN, NbTiN, and Pb. In an example embodiment, capacitive plates 404 may be about 1 to 100 micrometer apart. In an example embodiment, capacitive plates 404 may have a width of about 5 to about 500 micrometers, a length of about 1 to about 200 micrometers, and a height of about 10 to about 500 nanometers from the surface of substrate 400.

As a result of the fabrication process, the qubit structures formed may have substantially similar dimensions (e.g., size and shape of capacitive plates and Josephson junction) as one another. However, fabrication conditions during formation of the Josephson junction 402 may result in variation of the resulting resistance of the Josephson junction 402, due to process parameters being uncontrolled at the nanometer level. For Josephson junctions utilized in single-junction transmon qubits this variation in resistance may be +/−2%. A variation in junction resistance introduces a corresponding variation in qubit frequency. For example, in a single junction transmon qubit a +/−2% variation in junction resistances leads to a −/+1% variation in the frequencies of the qubits. According to FIG. 3, annealing may be performed to adjust the resistance of the Josephson junctions 402 in order to align with the originally desired resistance in order to reduce the probability of a frequency collision with another qubit.

Figure 3:
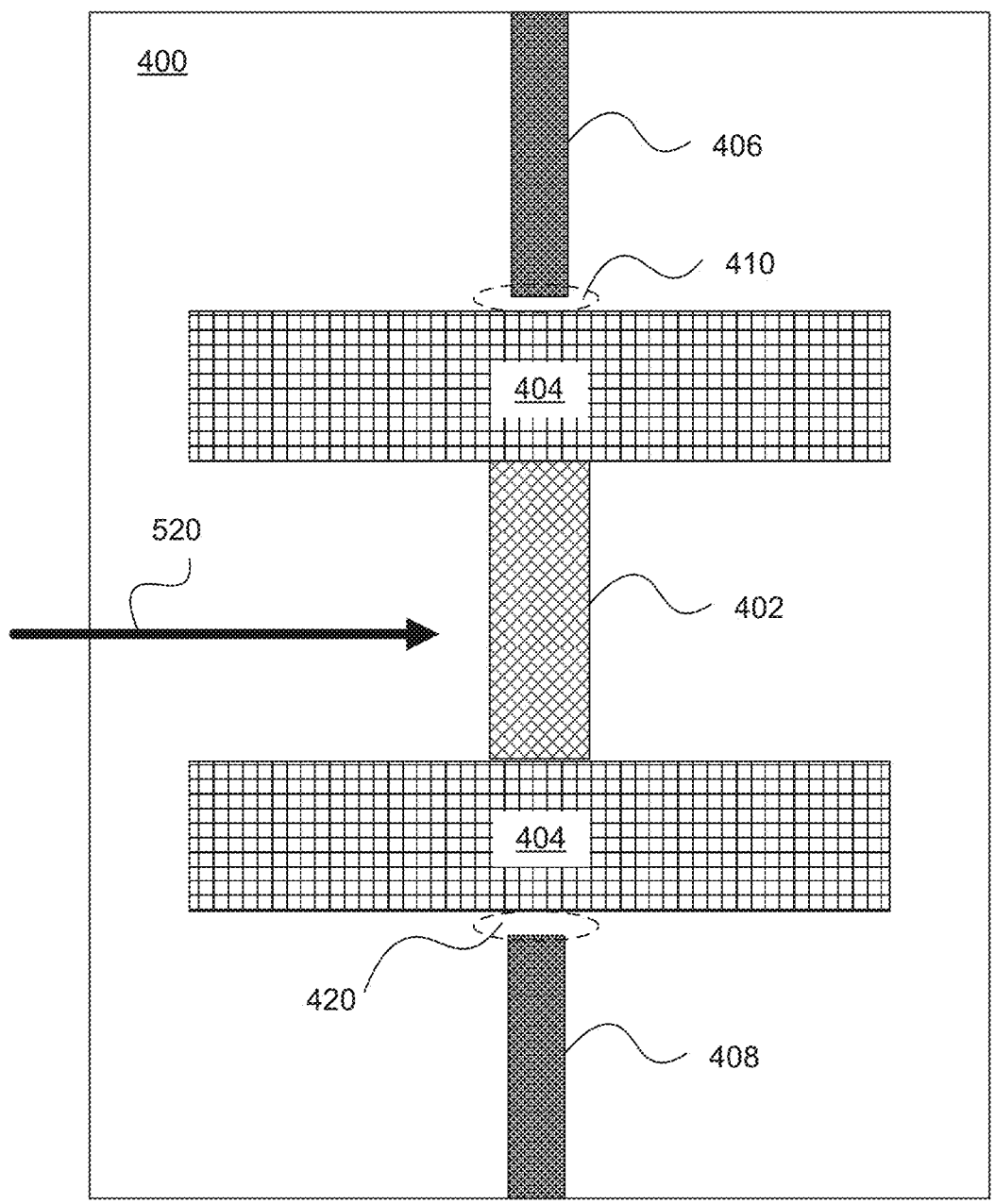
FIG. 3 depicts a top view of an example qubit undergoing a laser anneal, in accordance with embodiments of the present invention.

Referring to FIG. 3, the qubit 500 may be annealed to adjust the resistance of the Josephson junction 402 in order to adjust the frequency of the qubit. Annealing of the Josephson junction 402 may include heating the Josephson junction 402 to allow for a physical change to occur within the Josephson junction 402 that results in a change in the resistance. In annealing of the Josephson junction 402, annealing below a threshold dose may result in an increase in the resistance of the Josephson junction 402, while annealing above that threshold may decrease the resistance of the Josephson junction 402. In an embodiment, annealing of the Josephson junction 402 may be done by laser annealing, via thermal source 520, which may enable localized heating to the Josephson junction 402. In an example embodiment, laser annealing may be performed using a doubled Nd:YAG source, emitting a laser having a 532 nm wavelength. However, various other wavelengths of light may be used or tested to determine an optimal path to shift the frequency of the qubit. In the example embodiment, a threshold dose may be about 1.4 W for 10 seconds. Thus, in the example embodiment, annealing the Josephson junction 402 at doses below 1.4 W for 10 seconds would lead to an increase in resistance, while annealing at doses above 1.4 W for 10 seconds would lead to a decrease in resistance. Based on methods of the embodiment, power, light frequency and duration of the anneal may be tested to determine and adjusted to achieve the proper frequency shift for a given set of conditions.

Figure 4:
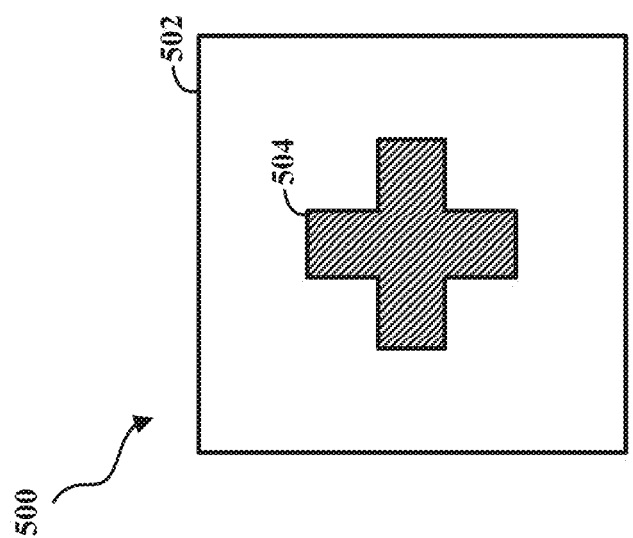
FIG. 4 depicts an example diagram of a top view of a chip assembly in accordance with embodiments of the present invention.
Figure 5:
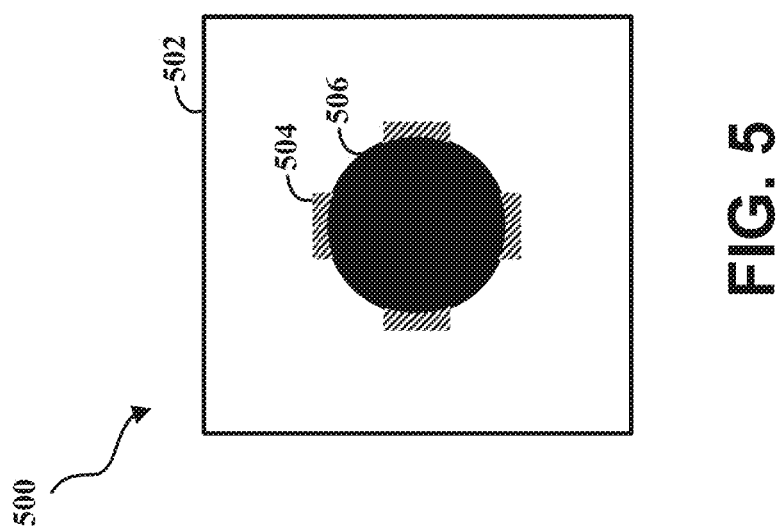
FIG. 5 depicts an example diagram of a top view of a flip chip assembly following the formation of a through-hole, in accordance with embodiments of the present invention.

FIG. 4 depicts an example diagram of a top view of a chip assembly, according to embodiments. Top chip 502 may have an alignment mark 504. FIG. 5 depicts an example diagram of a top view of a flip chip assembly 500 following formation of a through-hole 506. In embodiments, flip chip assembly 8500 of each of FIGS. 4 and 5 may be a top view of the same chip assembly, before and after an optically transmissive path (e.g., a through-hole) has been drilled, using, for example, a high-power laser beam. Similarly, chip 502 in FIGS. 4 and 5 may represent the top chip (i.e., the only chip visible from the top view), which may be the I/O chip of the chip assembly, before and after the through-hole is drilled, respectively.

In embodiments, the top chip 502 may be made of silicon. As described herein, the top or I/O chip could also be made of a transparent material, for example, sapphire, thus eliminating the need for the through-hole 506 present in chip 502. A material is transparent if it allows sufficient light to pass through the material to perform a desired treatment (e.g., laser annealing). In embodiments, an alignment mark 504 may be made on the silicon chip 502. The mark can serve as a tool to indicate the correct location and position for the laser drilling. The alignment mark 504 of FIG. 4 may be the same alignment mark as 504 of FIG. 5, following the formation of the through-hole 506. In embodiments, formation of the through-hole 506 comprises removing a portion of material from the chip, resulting in a hole through the chip. In an example embodiment, formation of the through-hole may be performed using laser drilling, mechanical drilling, or chemical etching (as described in FIG. 8A-F and FIG. 9A-F). As illustrated at FIG. 5, a portion of the alignment mark 504, may remain following the creation of the through-hole 506. In embodiments, the through-hole may have a diameter of up to 100 microns. In embodiments, the through-hole may be of a diameter large enough to allow for further access to or treatment of one or more qubits on the qubit chip of the flip chip assembly 500.

Figure 6:
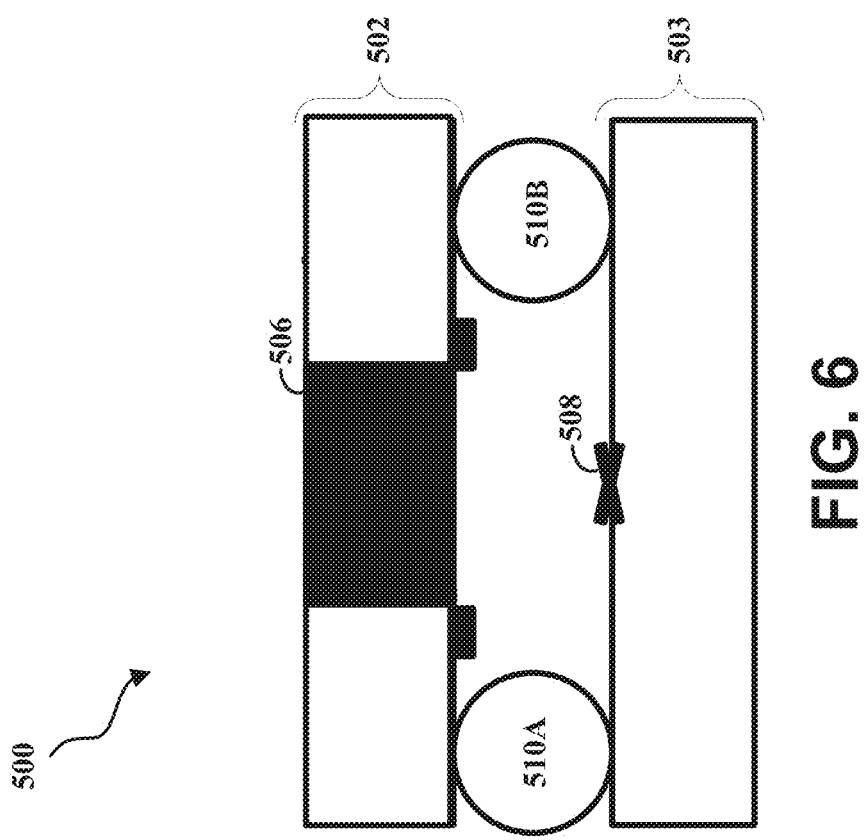
FIG. 6 depicts a cross-sectional view of flip chip assembly that has been modified to allow for qubit treatment, in accordance with embodiments of the present invention.

FIG. 6 depicts a cross-sectional view of flip chip assembly 500 that has been modified to allow for qubit treatment, according to embodiments. In embodiments, the flip chip fabrication may be carried out prior to or following the formation of the through-hole depicted at FIGS. 4 and 5. Flip chip assembly 500 is a cross-sectional view of the flip chip assembly 500 of FIGS. 4 and 5. As discussed herein, the flip chip assembly 500 comprises a top or I/O chip 502 and a bottom or qubit chip 503. The I/O chip 502 and the qubit chip 503 are connected by a plurality of solder bumps (collectively, solder bumps 510), including solder bump 510A and solder bump 510B. In embodiments, and according to known methods, a plurality of solder bumps may be used to connect the two chips to form the 3D chip assembly 500. The 3D assembly may include physically stacking one or more components (e.g., top or I/O chip 502 and bottom or qubit chip 503) and applying a temperature and a pressure to cause the solder bumps 510 to reflow and form an electromechanical connection between the two components. In embodiments, a thermal compression tool, such as a flip-chip bonder, may be used to apply the temperature and the pressure, thereby forming the solder bump connections.

In embodiments, reflow may be required. The reflow temperatures of common lead-free solder bumps may range from about 230° C. to about 260° C., and the temperatures used in the thermal compression tool may range from about 230° C. to about 400° C. The applied temperatures of the thermal compression tool may depend on the interconnect material and chip size. A pressure ranging from about $6.0 \times 10^4$ Pa to about $6.0 \times 10^5$ Pa may be applied during the 3D assembly using the thermal compression tool, although this pressure may be adjusted based on the contact area and materials to be interconnected. In one embodiment, a force ranging from about 5 N to about 50 N may be applied. The force too may be adjusted based on the contact area and materials to be interconnected. In some cases, there may be between 1,000 and 170,000 solder bump connections between components.

In some embodiments, the solder bumps 510 may comprise one or more superconducting materials, for example, indium. In embodiments, the qubit chip may contain one or more Josephson junctions 508.

Figure 7:
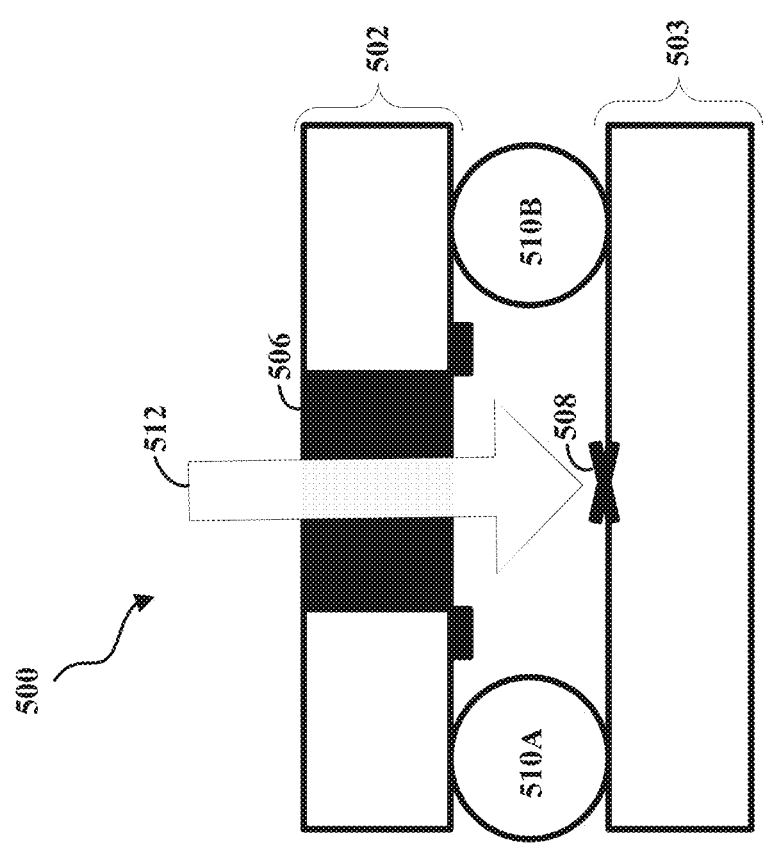
FIG. 7 depicts a cross-sectional view of a flip chip assembly with a qubit undergoing a laser anneal, in accordance with embodiments of the present invention.

As depicted in FIG. 7, the through-hole 506 (which is an optically transmissive path), is aligned with Josephson junction 508 to provide access to the Josephson junction 508, for example, to enable treatment by a laser or other qubit processing techniques. Josephson junction 508 of flip chip assembly 500 of FIGS. 6-7, may receive treatment by a laser beam 512, for example, to anneal the Josephson junction 508. In embodiments, the through-hole 506 may be designed to allow for laser beam treatment, as discussed above, but it is not necessarily limited to providing access exclusively for treatment by a laser beam 512. For example, the through-hole 506 may be configured to provide access to the Josephson junction 508 for a physical treatment (e.g., focused ion beam treatment, sputtering), or other treatment. Thus, while the path is described as "optically transmissive", it is noted that the path may be optically transmissive and also transmissive physically, electrically, or otherwise, thus providing for a variety of treatments of the Josephson junction 508.

In embodiments, the Josephson junction 508 may be part of a superconducting qubit. Each such qubit may comprise at least one Josephson junction (for example, Josephson junction 508), and or more capacitors. In embodiments, the through-hole 506 (or other optically transmissive path) may be aligned to provide access to the Josephson junction (as described above), to a capacitor of the qubit, or to another component of the qubit.

In embodiments, as shown in FIG. 7, a laser beam 512 may be used to treat the Josephson junction 508 through the through-hole 506. The through-hole 506, as depicted, is wide enough to allow for access to the Josephson junction 508, by, for example, a laser beam 512. Additionally, or alternatively, through-hole 506 may be used to access Josephson junction 508 for chemical or mechanical treatments, such as etching, depositions or polishing steps. The laser beam 512 may be used to anneal a Josephson junction within a qubit, as discussed herein.

Figure 8A:
FIG. 8A-8F depict diagrams of a method of etching a through-hole in a first chip of a flip chip assembly, in accordance with embodiments of the present invention.
Figure 8B:
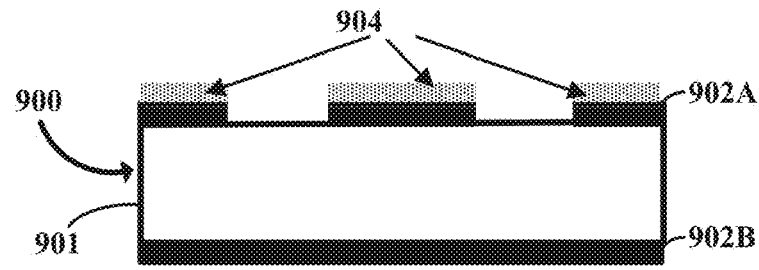

FIGS. 8A-F depict the formation of an optically transmissive path in an I/O chip 900 (e.g., a top chip, a first chip) of a flip chip assembly, according to a method described herein. The diagrammatic flow of FIGS. 8A-F depicts I/O chip 900 at different stages of fabrication of the optically transmissive path (e.g., a through hole). The etching in FIGS. 8A-F may be accomplished using a tetramethylammonium hydroxide (TMAH) etch. FIG. 8A depicts an I/O chip 900. The I/O chip 900 may be composed of silicon. In other embodiments, I/O chip 900 may also contain other elements, including those which may be present in a typical chip. In embodiments, I/O chip 900 may be a part of a flip chip assembly. In embodiments, I/O chip 900 may be I/O (e.g., top) chip 502 depicted in FIG. 4-7. I/O chip 900 may undergo a series of steps in a chemical etching process, using, for example, a TMAH etch.

At FIG. 8A, chip substrate 901 may have two layers of oxide, first oxide layer 902A and second oxide layer 902B (collectively oxide layers 902), located on a top and a bottom surface, respectively, which may be formed according to known methods. The oxide layers 902 (i.e., oxide layers 902 in FIGS. 8A-8E) may act as a hard mask, etch stop and a lithography enabler. At FIG. 8B, first oxide layer 902A may be etched. Using photolithography, the etch holes may be defined, as depicted by spaces in the additional layer of resist (e.g. photoresist 904), which can also be removed during the etching. Each through-hole 906 (depicted in FIGS. 8C-8F) may be up to 100 microns in diameter, at its narrowest point.

Figure 8C:
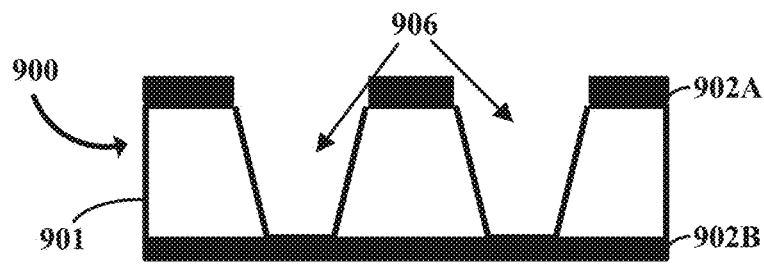
Figure 8D:
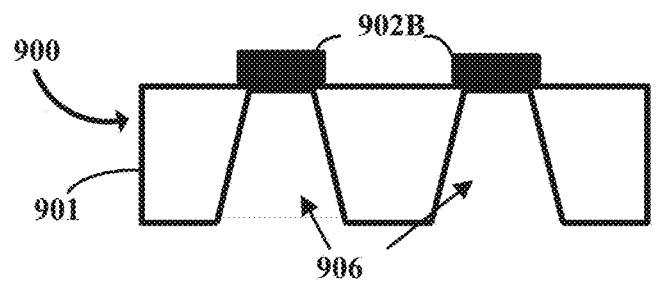

At FIG. 8C, through-hole 906 may be created in chip substrate 901. A through-hole 906 (depicted in FIGS. 8C-8F) may be created in the chip substrate 901, as depicted. In embodiments, the photoresist 904 as depicted in I/O chip 900 at FIG. 8B may be removed during the previous step following the through silicon etch using a TMAH etch. In embodiments, the TMAH etch may remove material conically, resulting in a frustoconical through-hole, and may allow for treatment of an underlying qubit, such as delivery of a desired laser power to the qubit. As depicted in FIG. 8D, the first oxide layer 902A on the top surface may be removed by an additional oxide plasma or chemical etch. At FIG. 8D, the I/O chip 900 is inverted. Portions of the second oxide layer 902B adjacent to each of the through-holes 906 may be patterned using photolithography and etched with an oxide etch. The oxide etch with resist protection may be a dry etch or a hydrofluoric acid (HF) vapor etch. In embodiments, the HF vapor etch may etch both sides of the wafer at once. In embodiments, the use of the HF vapor etch may allow for the preservation of the second oxide layer 902B on top of the etch holes of the wafer (e.g., to allow for further photolithography processing). In embodiments, for larger holes, a tensile stoichiometric silicon nitride layer may be used.

Figure 8E:
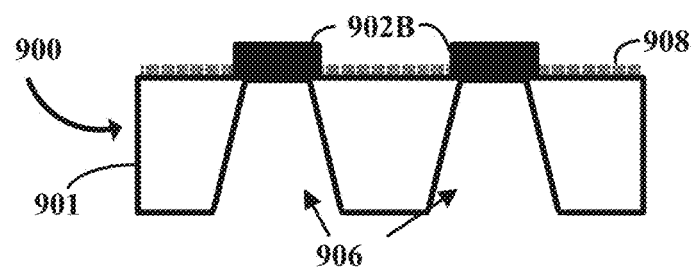

At FIG. 8E, a superconducting pattern 908 may be formed on the top surface of chip 900, for microwave resonator circuitry. Using photolithography, the microwave resonators may then be defined, followed by a lift off/RIE (reactive ion etching) etch of the metal. The superconducting pattern 908 may comprise aluminum, niobium, or any other superconducting material that is deposited by conventional means such as sputtering, evaporation or atomic layer deposition. The step depicted at FIG. 8E may also result in the removal of the metal (e.g., superconducting pattern 908) that is deposited on top of the remaining second oxide layer 902B.

Figure 8F:
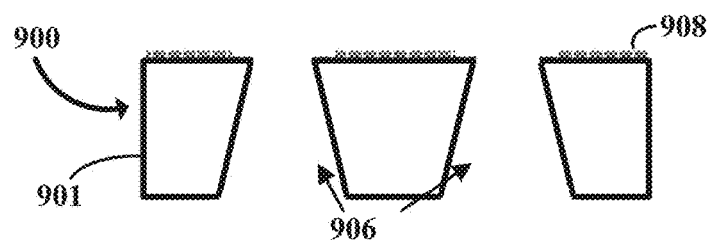

At FIG. 8F, a dry etch of oxide using an oxide-specific etch chemistry, for example, an HF vapor etch, may be performed. In embodiments when the etch is oxide-specific, a pattern protect may be unnecessary. In other embodiments, a pattern resist may be used around the oxide (e.g., to cover the superconducting pattern 908). In this way, the oxide may be exposed to the etch, while the photoresist may protect the superconducting pattern 908. At this point, the superconducting pattern 908 for the microwave resonator circuitry may remain on the chip substrate 901 of FIG. 8F. The chip 900 may be bump-bonded to another chip, for example, a qubit chip, as described herein.

Figure 9A:
FIGS. 9A-9F depict diagrams of a method of etching a through-hole in a top chip of a flip chip assembly using a deep reactive ion-etching technique, in accordance with embodiments of the present invention.

FIGS. 9A-9F depict the formation of an optically transmissive path in a top chip 1000 (e.g., an I/O chip) of a flip chip assembly, according to a method described herein (e.g., a Bosch etch). The diagrammatic flow of FIGS. 9A-9F depicts top chip 1000 at different stages of fabrication of the optically transmissive path (e.g., a through-hole). FIG. 9A depicts a top chip 1000. The top chip 1000 may be composed of silicon. In other embodiments, top chip 1000 may also contain other elements, including those which may be present in a typical chip. In embodiments, the top chip 1000 may be a part of a flip chip assembly, for example, an I/O chip. Top chip 1000, depicted in FIGS. 9A-9F, may undergo a series of steps in a chemical etching process, using, for example, a Bosch etch.

Figure 9B:
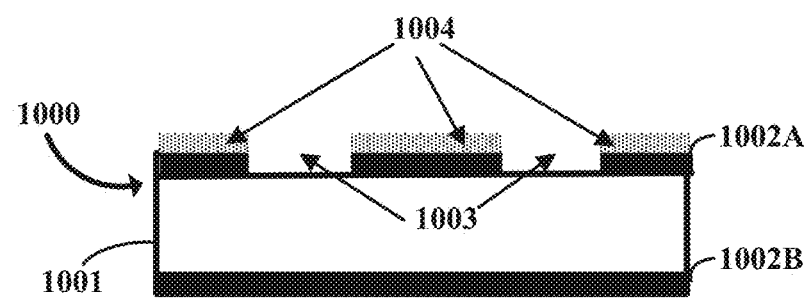

Substrate 1001 may have a first oxide layer 1002A and second oxide layer 1002B (collectively, oxide layers 1002), located on both a top and bottom surface of substrate 1001, and formed according to known methods. The oxide layers 1002 may act as a hard mask, etch stop and/or a lithography enabler. Portions of the first oxide layer 1002A may be etched to transition top chip 1000 as depicted in FIG. 9A to top chip 1000 as depicted in FIG. 9B. Using photolithography, the etch holes 1003 may be defined; the etch holes 1003 may be further defined by the additional layer of resist (e.g. photoresist 1004), which can also be deposited prior to the etching and removed during the etching. Each etch hole 1003 may be up to 100 microns in diameter.

Figure 9C:
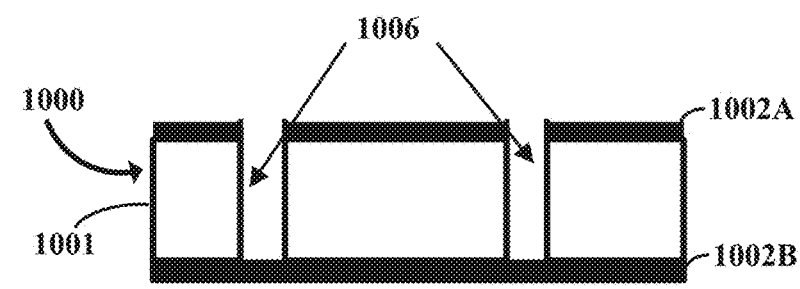
Figure 9D:
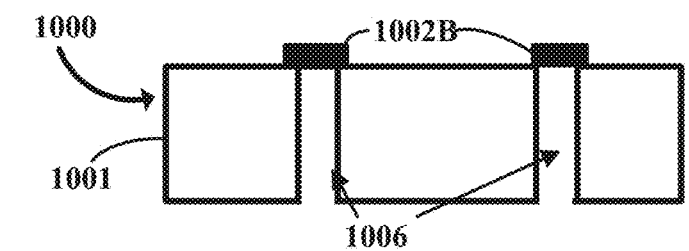

At FIG. 9C, a silicon etch may be made in the substrate 1001, according to embodiments. The through-holes 1006 (e.g., through-holes 1006 pictured at FIGS. 9C-9F) may be created in the substrate 1001, as depicted. In embodiments, the photoresist 1004 depicted at FIG. 9B may be removed before or after the through-hole 1006 formation. However, performing the Bosch etch before removing photoresist 1004 may create more difficulty in removal of photoresist 1004. In embodiments, the Bosch etch removes material in a cylindrical shape, and may require higher power than another etch, for example the TMAH etch, to deliver the desired laser power to the sample, depending on, for example, wafer thickness and focal distance of the lens in the annealing treatment, due to the higher aspect ratio compared to the TMAH etch (less tapering than TMAH). The first oxide layer 1002A may be removed by an additional oxide plasma or chemical etch. At FIG. 9D, the top chip 1000 may be inverted, and the second oxide layer 1002B may be patterned around each of the etch holes using photolithography and followed by an oxide etch of the second oxide layer 1002B surrounding the etch holes, according to embodiments. The oxide etch with resist protection may be a dry etch or a hydrofluoric acid (HF) vapor etch. In embodiments, the HF vapor etch may etch both sides of the wafer at one. In embodiments, the use of this HF vapor etch may allow for the preservation of the second oxide layer 1002B on top of the etch holes of the wafer (e.g., to allow for further photolithography processing). In embodiments, for larger holes, a tensile stoichiometric silicon nitride layer may be used.

Figure 9E:
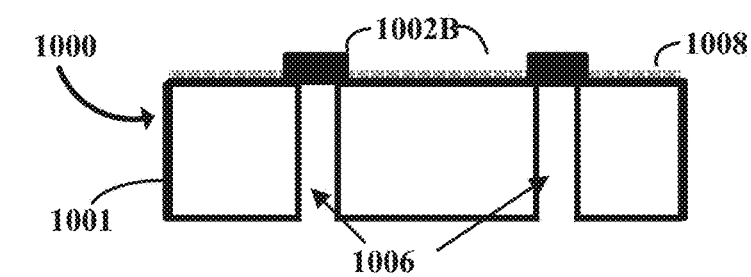

At FIG. 9E, a superconducting pattern 1008 may be formed on the surface of chip 1000, for microwave resonator circuitry, according to embodiments. Using photolithography, the microwave resonators may then be defined, followed by a lift off/RIE (reactive ion etching) etch of the metal. The superconducting pattern 1008 may comprise aluminum, niobium, or any other superconducting material that is deposited by conventional means such as sputtering, evaporation or atomic layer deposition. In addition to the formation of the superconducting pattern 1008, the step depicted at FIG. 9E may also result in the removal of the metal (e.g., superconducting pattern 1008) on top of the remaining oxide 802.

Figure 9F:
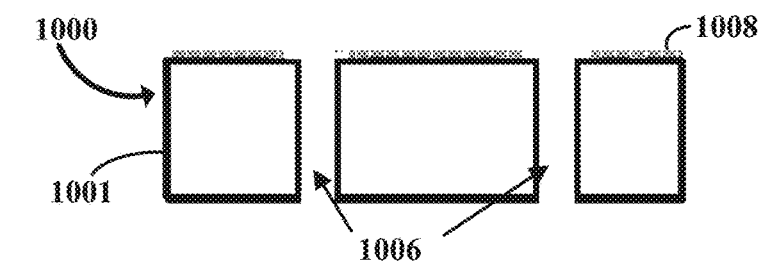

At FIG. 9F, a dry etch of oxide using an oxide specific etch chemistry, for example, an HF vapor etch, may be performed on top chip 1000, according to embodiments. At this point, the superconducting pattern 1008 for the microwave resonator circuitry may remain on the substrate 1001, and the chip may then be bonded to another chip, for example, a qubit chip, as described herein.

Figure 10:
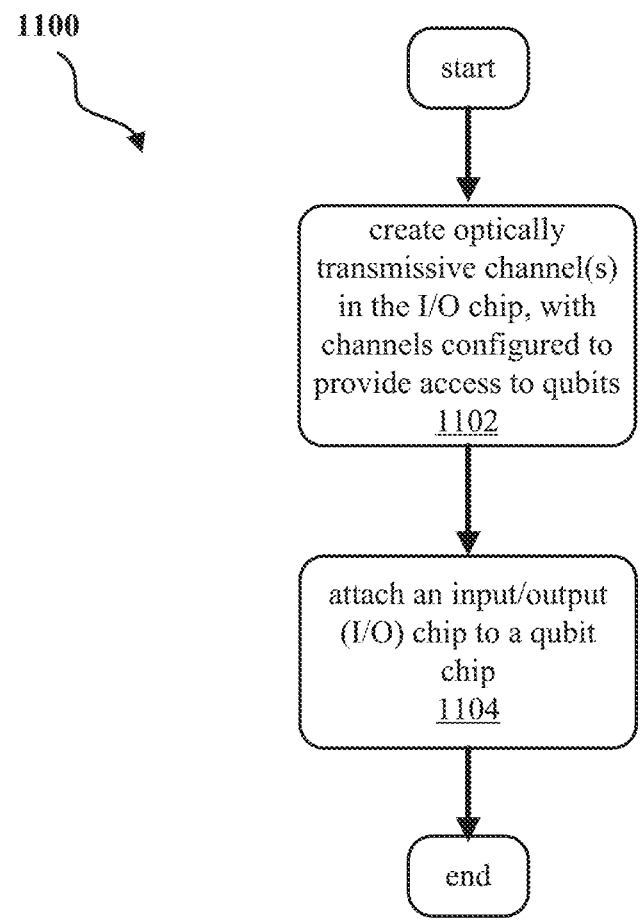
FIG. 10 depicts a flow diagram of an example method 1100 for forming a qubit flip chip assembly, in accordance with embodiments of the present invention.

FIG. 10 depicts a flow diagram of an example method 1100 for forming a qubit flip chip assembly, according to embodiments. The method 1100, as described herein, may start when one or more optically transmissive channels are created in an I/O chip. As described herein, the optically transmissive channels may be a through-hole or other optically transmissive path which provides for optical access, physical access, or other access to the qubit of the chip (e.g., a particular Josephson junction of the qubit). The optically transmissive channel (e.g., a through-hole) may be created as described herein. Following the creation of the channel, the I/O chip may be attached to a qubit chip (1104). In embodiments, the chips may be attached to assemble a flip chip using, for example, a plurality of solder bumps. In embodiments, the I/O chip may contain I/O circuitry, and the qubit chip may contain one or more qubits, as described herein. In embodiments, operation 1102 and operation 1104 may occur in either order relative to one another, either with the channels created prior to or after the attachment of the I/O chip and the qubit chip.

By following the above steps, a structure having an I/O chip fastened to a qubit chip is formed. The I/O chip has one or more optically transparent paths located adjacent to (e.g., above, etc.) one or more qubits of the qubit chip. The optically transparent paths may be through-holes, or alternatively may be a transparent material. The I/O chip may contain superconducting circuitry located on the top and/or bottom surface of the I/O chip. The I/O chip may be connected to the qubit chip through a plurality of solder bumps, or alternatively through other means of chemically or mechanically fastening two chips together.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a quantum bit (qubit) flip-chip assembly, the method comprising:
   forming a qubit on a first chip;
   forming an optically transmissive path in a second chip; and
   bonding the first chip to the second chip; and
   wherein the optically transmissive path is located adjacent to the qubit.

2. The method of claim 1, wherein the path has an aperture with a diameter large enough to allow for treatment of the qubit.

3. The method of claim 1, wherein the optically transmissive path has an aperture of 100 microns or less.

4. The method of claim 1, further comprising laser annealing the qubit by applying a laser through a surface of the qubit chip that is opposite the second chip.

5. The method of claim 1, further comprising ion etching the qubit.

6. The method of claim 1, wherein the forming the optically transmissive path comprises drilling, using a high-power laser beam, the second chip to form a through-hole in the second chip.

7. The method of claim 6, wherein the etching comprises deep-reactive ion etching.

8. The method of claim 6, wherein the etching comprises a chemical etch, and wherein the chemical etch is a tetramethylammonium hydroxide (TMAH) etch.

9. The method of claim 1, wherein the forming the optically transmissive path comprises etching a through-hole in the second chip.

10. The method of claim 1, wherein the second chip comprises a transparent substrate.

11. The method of claim 10, wherein the transparent substrate is Magnesiumoxide (MgO).

12. A flip chip apparatus comprising:
   a first chip comprising a qubit; and
   a second chip bonded to the first chip, wherein an optically transmissive path in the second chip provides for optical access to the qubit on the first chip.

13. The apparatus of claim 12, wherein the second chip comprises a transparent substrate.

14. The apparatus of claim 13, wherein the transparent substrate is sapphire.

15. The apparatus of claim 12, wherein the optically transmissive path has a diameter large enough to allow for treatment of one or more of the plurality of qubits.

16. The apparatus of claim 12, wherein the qubit is accessible for laser annealing via the optically transmissive path.

17. The apparatus of claim 12, wherein the optically transmissive path of the second chip is aligned with the qubit on the first chip.

18. The apparatus of claim 12, wherein the optically transmissive path is formed with a chemical etch.

19. The apparatus of claim 12, wherein the optically transmissive path is formed using a high-power laser beam.

20. The apparatus of claim 12, wherein the first chip is comprised of a transparent substrate.

* * * * *